United States Patent
Grayzel

[11] 4,025,872
[45] May 24, 1977

[54] NEGATIVE RESISTANCE NETWORK

[76] Inventor: Alfred I. Grayzel, Slope & Shore, New London, N.H. 03257

[22] Filed: Aug. 1, 1975

[21] Appl. No.: 601,146

[52] U.S. Cl. .................................. 330/34; 331/172; 330/53; 330/61A

[51] Int. Cl.² .......................................... H03F 3/10

[58] Field of Search ................. 330/34, 53, 61 A; 331/172; 328/16, 19; 321/69 NL

[56] References Cited

UNITED STATES PATENTS

| | | | |
|---|---|---|---|
| 3,341,714 | 9/1967 | Käch | 321/69 NL |
| 3,576,499 | 4/1971 | Axford et al. | 328/16 X |
| 3,588,727 | 6/1971 | Seidel | 330/34 |
| 3,646,581 | 2/1972 | Grace | 330/53 X |

OTHER PUBLICATIONS

Hines, "FM Noise Suppression of an Injection Phase—Locked Oscillator," IEEE Transactions on Microwave Theory and Techniques, vol. MTT-16, No. 9, Sept. 1968, pp. 738-742.

*Primary Examiner*—James B. Mullins
*Attorney, Agent, or Firm*—Kenway & Jenney

[57] ABSTRACT

A network characterized at a reference terminal pair by a negative resistance at a frequency near $nf_o$, where $n$ is an integer greater than one. The network comprises a circuit element characterized by a negative resistance at frequencies in the range $f_1$ to $f_2$ where $f_1 < f_o < f_2$, a passive non-linear network and a filter network for coupling the negative resistance element to the passive non-linear network only at frequencies near $f_o$ and to the reference terminal pair only at frequencies near $nf_o$. The negative resistance network may be configured with suitable components as a negative resistance amplifier and as an injection locked oscillator.

22 Claims, 5 Drawing Figures

NEGATIVE RESISTANCE NETWORK

BACKGROUND OF THE INVENTION

The present invention relates to electronic circuits and more particularly, to negative resistance networks.

Circuit elements characterized by a negative resistance are well known in the art. Examples of such devices which may be configured to exhibit a negative resistance characteristic are transistors, semi-conductor pn junctions and Gunn devices. These devices exhibit negative resistance characteristics only over specific frequency bands and are limited in the maximum power handling capability. There are many applications where amplification is desired to provide power levels at frequencies for which there are no presently known negative resistance devices suitable for use with well-known negative resistance amplifier configurations. In many such cases, the desired power level could be attained at lower frequencies using presently known negative resistance devices, but not at the desired frequencies. Where amplification is required at power levels and frequencies for which negative resistance devices do not exist, the prior art teaches the use of travelling wave tubes in spite of the accompanying disadvantages compared with solid state circuits.

The present invention may also be used in relatively low power high frequency applications. In some such configurations, the associated noise figure is relatively low compared with that attained using presently-known circuits.

An alternative approach known in the prior art is to use a frequency convertor to image low frequency circuit components (such as a negative resistance diode) at a high frequency, see U.S. Pat. No. 3,588,727. However, this approach is subject to a substantial disadvantage since such a convertor requires relatively complex circuitry including an active circuit means for generating a pump signal for transforming the convertor input signal to an output signal at the desired frequency.

It is an object of this invention to provide an improved network characterized by a negative resistance at frequencies and power levels which are higher than those of available negative resistance devices.

Another object of this invention is to provide an improved negative resistance amplifier for operation at relatively high frequencies.

It is still another object of this invention to provide an improved negative resistance oscillator for operation at relatively high frequencies.

A further object of this invention is to provide an improved negative resistance oscillator which may be injection locked at relatively high frequencies.

Yet another object is to provide circuit configurations characterized by a relatively low noise figure.

SUMMARY OF THE INVENTION

According to the present invention, a network characterized at a reference terminal pair by a negative resistance at a frequency near $nf_o$, where $n$ is an integer greater than 1, may be realized by utilizing a circuit element characterized by a negative resistance over the frequency range $f_1$ to $f_2$, where $f_1 < f_o < f_2$, passive non-linear network (such as a multiplier) including means responsive to an applied signal near frequency $f_o$ to generate the $n^{th}$ harmonic of said applied signal, and further including a filter network for coupling the negative resistance circuit element to the nonlinear network only at frequencies near $f_o$ and to the reference terminal pair only at frequencies near $nf_o$. Thus, a negative resistance circuit element may be configured with passive circuit components to provide a network characterized by a negative resistance at a frequency beyond the frequency range in which the circuit element itself exhibits negative resistance characteristics.

The combination of components taught in this invention permits the use of any negative resistance device to achieve amplification at higher frequencies than those at which the device itself can operate.

For example, the contemporary state of the art can produce transistors capable of providing 25 watts of output power at 1.5 GHz and which can be used in a negative impedance circuit configuration. At 6 GHz, such transistors may typically provide power levels of less than 1 watt. Using a 25 watt (at 1.5 GHz) transistor, for example, and a network configuration in accordance with the present invention (i.e., a passive non-linear network and a filter which would provide a negative resistance at the fourth harmonic, 6.0 GHz), provides an amplifier with at least 10 watt output power at 6.0 GHz.

Furthermore, the combination of components taught in this invention may be utilized in conjunction with an injection signal oscillator in an injection-locked oscillator configuration wherein a locking signal is injected at the output frequency near $nf_o$.

BRIEF DESCRIPTION OF THE DRAWINGS

The foregoing and other objects of this invention, the various features thereof, as well as the invention itself, may be more fully understood from the following description when read together with the accompanying drawings, in which.

DESCRIPTION OF THE PREFERRED EMBODIMENT

Figure 1:
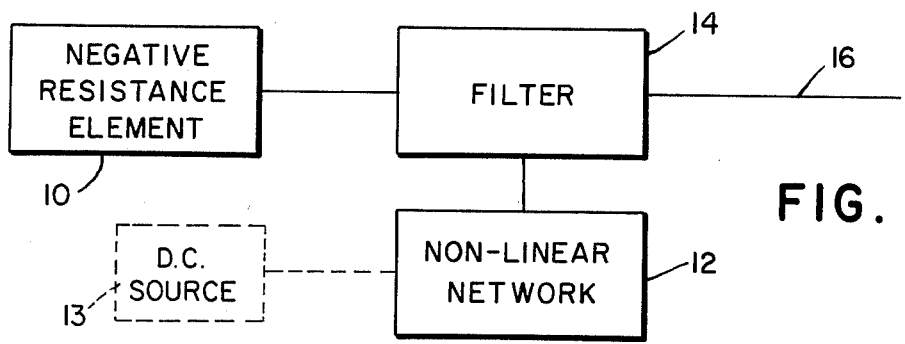
FIG. 1 shows in block diagram form a negative resistance network in accordance with the present invention.

FIG. 1 shows an embodiment of the present invention in block diagram form. This embodiment includes a negative resistance circuit element 10, a passive non-linear network 12 and a filter network 14 for coupling the circuit element 10 via non-linear network 12 to terminal pair 16. Negative resistance circuit element 10 may be any known circuit element characterized by a negative ratio of voltage across the element to current through the element over a frequency range $f_1$ to $f_2$, where $f_o$ lies in that range.

Network 12 may comprise one or more known passive circuit elements, each being characterized by a non-linear relationship of the voltage across that element and either the current passing through that element, the charge stored by the element or the magnetic flux produced by the current passing through the element, and is responsive to an applied signal near frequency $nf_o$ to generate the $n^{th}$ harmonic of the applied signal. Preferably, the network 12 should be relatively low loss in order to maximize the gain, minimize the noise figure and maximize the power output of the overall negative resistance network. Thus, non-linear reactances are preferred to non-linear resistances, although the latter may be used in some cases.

For example, the passive non-linear network 12 may comprise a multiplier or divider utilizing a non-linear capacitance such as provided by a reverse biased pn junction (varactor) or in some cases, the series or parallel combination of a number of reversed biased pn junctions. It will be understood that network 12 may include a biasing network, and may also include idlers, see for example, D.H. Steinbrecher, "Efficiency Limits for Tuned Harmonic Multipliers with Punch-Through Varactors", Digest of Technical Papers, International Solid-State Circuits Conference, 1967, pp. 20–21. In some embodiments wherein network 12 comprises a reverse biased pn junction diode, the diode may merely be left open-circuited to establish a self-bias or alternatively, a biasing resistance may be connected across the diode. In the latter case, the value of such resistance may be determined experimentally by well-known techniques. Alternatively, in some embodiments, a step recovery diode may be used to provide the non-linear characteristic device in network 12. In still other embodiments, a non-linear inductance may be used in network 12. In alternative embodiments, a d.c. voltage source 13, shown by dashed lines in FIG. 1, may be added to act in concert with network 12 to bias the non-linear element to an operating point in its non-linear range.

The filter network 14 can be any known type of filter network which has the property that signals at frequencies near $f_o$ are coupled between the negative resistance element 10 and the non-linear network 12 and not to the terminal pair 16, while signals near frequencies $nf_o$ are coupled between the non-linear network 12 and terminal pair 16 and not to the negative resistance element 10. Furthermore, for optimum operation, the filter network 14 includes means for impedance matching the non-linear network 12 with the negative resistance device 10 at frequency $f_o$ and means for impedance matching the harmonic generating non-linear network 12 with an external load connected to terminal pair 16 at frequency $nf_o$.

Figure 2:
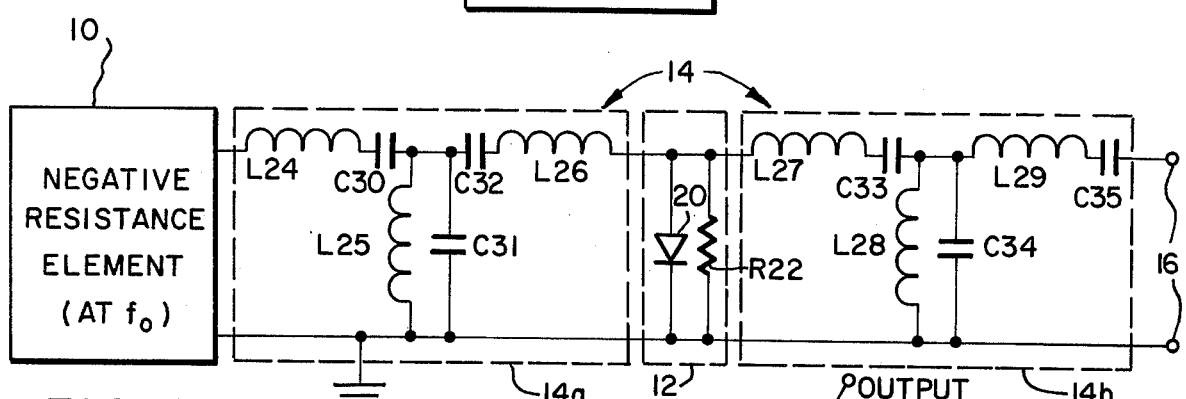
FIG. 2 shows in schematic form an exemplary configuration for the network of FIG. 1.

FIG. 2 shows a configuration of the present invention wherein the non-linear network 2 comprises a diode 20 and a shunt resistance 22 for reverse biasing diode 20. The filter network 14 comprises a first portion 14a for coupling negative resistance element 10 to the non-linear network 12, and a second filter portion 14b for coupling the non-linear network 12 to terminal pair 16. The circuit of FIG. 2 may use a device which exhibits a negative resistance at frequency $f_o$ approximately 500 MHz. Using well-known circuit techniques, the filters 14a and 14b may be adapted to provide at terminal 16, an effective negative resistance at frequencies approximately 1.0 GHz, i.e., the exemplary case where $n=2$. The filters include radio frequency coils L24–L29 and variable capacitors C30–C35. The coils L24–L26 have values selected to resonate at frequency $f_o$ (i.e., 500 MHz) with their respective capacitors C30–C32 when the capacitors are approximately in the center of their variable range. These three resonators, L coil 24 – capacitor C30, coil L25 – capacitor C31, coil L26 – capacitor C32, thus comprise a filter which passes signals near frequency $f_o$ and rejects signals at frequencies near $2f_o$. Using well-known techniques, the capacitors may be varied to impedance match the negative resistance element 10 with diode 20 at frequency $f_o$ while still rejecting signals at frequency $2f_o$. Similarly, radio freuency coils L27–L29 may be characterized by an inductance appropriate to resonate at frequency $2f_o$ with their respective capacitors C33–C35 when the capacitors are in the approximate center of their variable range. These latter three resonators, coil L27 – capacitor C33, coil L28 – capacitor C34, coil 29 – capacitor 35, thus comprise a filter which will pass signals near frequency $2f_o$ and reject signals near frequency $f_o$. Using well-known techinques, by varying the capacitors C33–C35, diode 20 may be impedance matched with an external load connected at terminal 16 at frequency $2f_o$ while filter portion 14b is still effective to reject signals near frequency $f_o$. Exemplary values for coils L24–L29 (in nanohenries), capacitors C30–C35 (in picofarads) and resistor 22 (in ohms) are given in Table I below. It will be understood however, that these values are merely nominal values and that well-known techniques may be used to experimentally determine the exact values for a particular circuit configuration. Furthermore, these values are only appropriate for the example given in FIG. 2 for use at UHF frequencies where lumped element networks can be used. At higher frequencies, the filters and matching networks may be configured in accordance with well-known design techniques including waveguide TEM lines (such as coaxial, slab-line, strip-line, and microstrip) and microwave filters (such as interdigital, combline and quarterwave stub filters).

TABLE I

| COMPONENT | VALUE |
|---|---|
| L24 | 30 nh |
| L25 | 6 nh |
| L26 | 30 nh |
| L27 | 15 nh |
| L28 | 3 nh |
| L29 | 15 nh |
| C30 | 1–10 pf |
| C31 | 10–30 pf |
| C32 | 1–10 pf |
| C33 | 1–10 pf |
| C34 | 5–5 pf |
| C35 | 1–10 pf |
| R22 | 60,000 ohms |

In another embodiment, the networks 12 and 14 may comprise a step recovery diode multiplier which, in addition to providing the above-noted signal coupling, provides impedance matching of the non-linear device (step recovery diode) with the negative resistance element and load at frequencies $f_o$ and harmonic frequencies thereof, see for example, S. Hamilton, R. Hall. "Shunt Mode Harmonic Generation Using Step Recovery Diodes," Microwave Journal. April, 1967, pp. 69–72.

Figure 3:
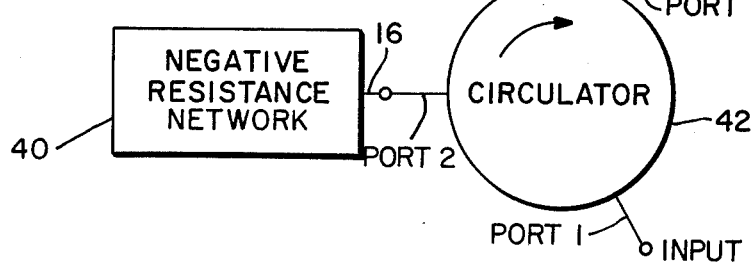
FIG. 3 shows in block diagram form a negative resistance amplifier in accordance with the present invention.

It is well known from the prior art that an amplifier at a given frequency, for example, $nf_o$, may be configured from a network characterized by a negative resistance over a band of frequencies including $nf_o$ and a further suitable component or network. One such well-known component is a circulator having at least three ports wherein a substantially unidirectional signal path is provided between a first (or input) port and a second (or intermediate) port, and between the second port and a third (or output) port. Using such a circulator, by terminating the second port (port 2) with a negative resistance network such as described above, and applying an input signal to the first port (port 1), the following result occurs: power entering port 1 of the circulator is coupled to port 2 where it is reflected to the output port (port 3). With port 2 being terminated in a negative resistance network, the reflection coefficient at that port is greater than unity and accordingly, the power delivered to port 3 is greater than the power applied at port 1. Thus, there is power gain at port 3 with respect to the signal applied at port 1. FIG. 3 shows in schematic form such a negative resistance amplifier using a three port circulator 42 and the negative resistance network 40 as described above in conjunction with FIGS. 1 and 2. Network 40 is connected via terminal 16 to port 2 of circulator 42.

Figure 4:
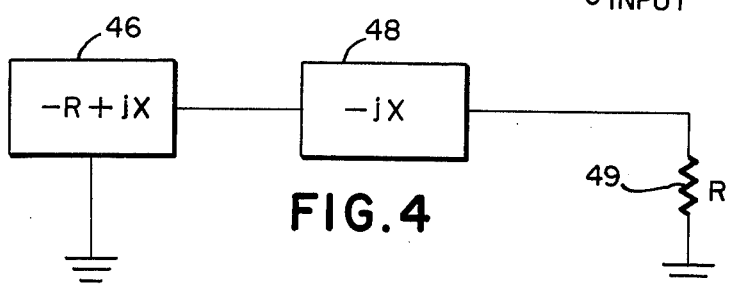
FIG. 4 shows in block diagram form a negative resistance oscillator in accordance with the present invention.

It is also well known from the prior art that a negative resistance network which is characterized by a complex impedance of the form $-R+jX$, may be terminated by an impedance characterized of the form $+R-jX$ in order to provide an oscillator. Such a configuration is indicated in FIG. 4 wherein negative resistance network 46 is connected to conjugate network 48 and resistor 49 to provide an oscillator configuration. It will be understood that the negative resistance network 46 is similar in form to that shown in FIGS. 1 and 2. The component values for conjugate network 48 and resistance network 49 may be readily determined using well-known techniques so that the real part of the impedance of network 46 equals the negative of the impedance of resistor 49, and the imaginary part of the impedance of network 46 equals the negative of the impedance of conjugate network 48.

Figure 5:
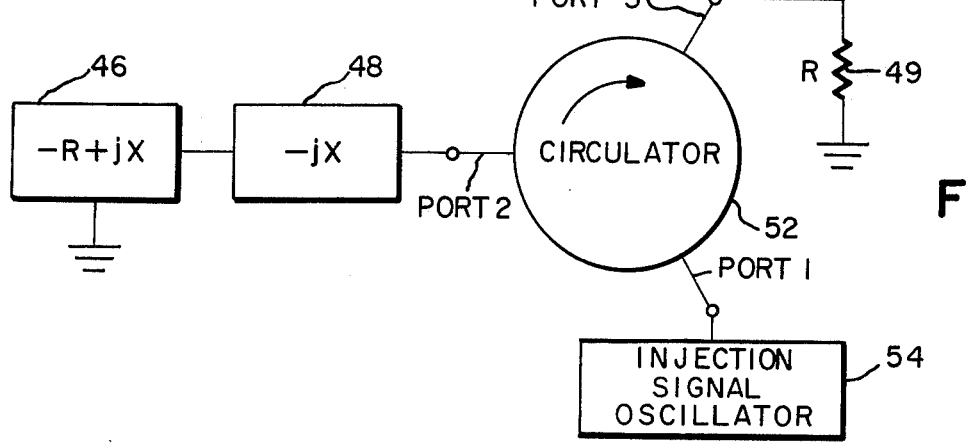
FIG. 5 shows in block diagram form an injection-locked oscillator in accordance with the present invention.

It will be further understood that oscillators such as shown in FIG. 4 may be injection-locked by providing a means to inject a small signal at a frequency near $nf_o$ within the locking range of the oscillator. By way of example, an injection-locked oscillator configuration is shown in FIG. 5 wherein negative resistance network 46, conjugate network 48 and resistor 49 are interconnected with a three port circulator 52 and injection signal oscillator 54. In this embodiment, a locking signal is effectively injected at the output frequency near $nf_o$. By varying the frequency of oscillator 54, the signal at resistor 49 may be frequency modulated.

Similar embodiments to those described above may also be used in relatively low power applications. In some such configurations, the associated noise figure is relatively low compared with that attained using prior art circuits.

The present invention may be embodied in other specific forms without departing from the spirit or essential characteristics thereof. The present embodiments are therefore to be considered in all respects as illustrative and not restrictive, the scope of the invention being indicated by the appended claims rather than the foregoing description, and all changes which come within the meaning and range of equivalency of the claims are therefore intended to be embraced therein.

I claim:
1. A network having two terminals and characterized at said two terminals by a negative resistance at frequency near $nf_o$, where $n$ is an integer greater than 1, said network comprising in combination:

A. a negative resistance circuit element wherein the ratio of the voltage applied across said element to the resultant current passing through said element is negative for applied voltages at frequencies in the range $f_1$ to $f_2$, wherein $f_1 < f_o < f_2$, B. a passive non-linear network including means responsive to an applied signal near frequency $f_o$ to generate the $n^{th}$ harmonic of said applied signal, C. a filter network including means for coupling said non-linear network to said negative resistance element only at frequencies near $f_o$, and for coupling said passive non-linear network to said terminals only at frequencies near $nf_o$.

2. A network according to claim 1 wherein said passive non-linear network includes a non-linear element which is characterized by a non-linear relationship between the voltage applied across said element and the current passing through said element.

3. A network according to claim 1 wherein said passive non-linear network includes a non-linear element which is characterized by a non-linear relationship between the voltage applied across said element and the charge stored by said element.

4. A network according to claim 3 wherein said non-linear element comprises a semiconductor diode and associated bias network adapted to maintain said diode in a reverse biased mode.

5. A network according to claim 4 further comprising a d.c. source associated with said bias network.

6. A network according to claim 3 wherein said non-linear element comprises a varactor and bias network.

7. A network according to claim 6 further comprising a d.c. source associated with said bias network.

8. A network according to claim 3 wherein said non-linear element comprises a step recovery diode and bias network.

9. A network according to claim 8 further comprising a d.c. source associated with said bias network.

10. A network according to claim 1 wherein said non-linear network includes a non-linear element which is characterized by a non-linear relationship between the voltage applied across said element and the magnetic flux produced by the current passing through said element.

11. A network according to claim 1 wherein said filter network further includes means to impedance match said non-linear network with said negative resistance element at frequencies near $f_o$.

12. A network according to claim 11 wherein said filter network further includes means to selectively control the impedance at said terminals to equal a predetermined value at frequencies near $nf_o$.

13. A network according to claim 1 wherein said filter network further includes means to selectively control the impedance at said terminals to equal a predetermined value at frequencies near $nf_o$.

14. A network according to claim 1 wherein said non-linear and filter networks comprise a varactor multiplier.

15. A network according to claim 14 further comprising a d.c. source associated with said bias network.

16. A network according to claim 1 wherein said non-linear and filter networks comprise a varactor divider.

17. A network according to claim 16 further comprising a d.c. source associated with said bias network.

18. A network according to claim 1 wherein said non-linear and filter networks comprise a step recovery diode multiplier.

19. A network according to claim 18 further comprising a d.c. source associated with said bias network.

20. A negative resistance amplifier comprising:
A. a circulator having at least three ports, an input port, an intermediate port and an output port, said circulator including a substantially unidirectional signal path for coupling signals at said input port to said intermediate port only, and a substantially unidirectional signal path for coupling signals at said intermediate port to said output port only, and
B. a two terminal network connected to said intermediate port, said two terminal network characterized at said terminals by a negative resistance at frequeny near $nf_o$, where $n$ is an integer greater than 1, said network comprising in combination:
   i. a negative resistance circuit element wherein the ratio of the voltage applied across said element to the resultant current passing through said element is negative for applied voltages at frequencies in the range $f_1$ to $f_2$, wherein $f_1 < f_o < f_2$,
   ii. a passive non-linear network including means responsive to an applied signal near frequency $f_o$ to generate the $n^{th}$ harmonic of said applied signal,
   iii. a filter network including means for coupling said non-linear network to said negative resistance element only at frequencies near $f_o$, and for coupling said non-linear network to said terminals only at frequencies near $nf_o$.

21. A negative resistance oscillator comprising:
A. a negative resistance network having two terminals and characterized at said two terminals by a negative resistance at frequency $nf_o$ where $n$ is an integer greater than 1, including:
   i. a negative resistance circuit element wherein the ratio of the voltage applied across said element to the resultant current passing through said element is negative for applied voltages at frequencies in the range $f_1$ to $f_2$, wherein $f_1 < f_o < f_2$,
   ii. a passive non-linear network including means responsive to an applied signal near frequency $f_o$ to generate the $n^{th}$ harmonic of said applied signal,
   iii. a filter network including means for coupling said non-linear network to said negative resistance element only at frequencies near $f_o$, and for coupling said non-linear network to said terminals only at frequencies near $nf_o$,
B. a conjugate network and resistance network connected in series across said terminals of said negative resistance network, said conjugate network being characterized by the negative of the imaginary portion of the impedance of said negative resistance network, and said resistance network being characterized by the negative of the real portion of the impedance of said negative resistance network.

22. An oscillator according to claim 21 further comprising means to inject a signal near frequency $nf_o$ across said resistance network.

* * * * *